United States Patent
Kawasaki et al.

(10) Patent No.: US 10,476,436 B2
(45) Date of Patent: Nov. 12, 2019

(54) RESONANT UNIT, VOLTAGE CONTROLLED OSCILLATOR (VCO) IMPLEMENTING THE SAME, AND PUSH-PUSH OSCILLATOR IMPLEMENTING A PAIR OF VCOS

(71) Applicant: Sumitomo Electric Industries, Ltd., Osaka-shi (JP)

(72) Inventors: Takeshi Kawasaki, Yokohama (JP); Tsuneo Tokumitsu, Yokohama (JP)

(73) Assignee: Sumitomo Electric Industries, Ltd., Osaka-shi (JP)

( * ) Notice: Subject to any disclaimer, the term of this patent is extended or adjusted under 35 U.S.C. 154(b) by 0 days.

(21) Appl. No.: 15/048,427

(22) Filed: Feb. 19, 2016

(65) Prior Publication Data

US 2016/0248142 A1   Aug. 25, 2016

(30) Foreign Application Priority Data

Feb. 20, 2015   (JP) .................. 2015-031823

(51) Int. Cl.

| H03B 7/06 | (2006.01) |
|---|---|
| H03J 3/20 | (2006.01) |
| H03B 5/18 | (2006.01) |
| H03B 1/00 | (2006.01) |
| H01P 5/18 | (2006.01) |
| H03L 1/02 | (2006.01) |
| H03L 7/00 | (2006.01) |
| H03L 7/08 | (2006.01) |
| H03L 5/00 | (2006.01) |

(Continued)

(52) U.S. Cl.
CPC .............. *H03B 7/06* (2013.01); *H03B 1/00* (2013.01); *H03B 5/18* (2013.01); *H03B 5/1847* (2013.01); *H03B 5/1852* (2013.01); *H03J 3/20* (2013.01); *H03L 1/022* (2013.01); *H03L 3/00* (2013.01); *H03L 5/00* (2013.01); *H03L 7/00* (2013.01); *H03L 7/06* (2013.01); *H03L 7/08* (2013.01); *H03L 7/0891* (2013.01); *H03L 7/10* (2013.01); *H03L 7/18* (2013.01); *H01P 5/185* (2013.01)

(58) Field of Classification Search
CPC ..... H03L 7/00; H03L 7/08; H03L 7/10; H03L 3/00; H03L 7/06; H03L 1/022; H03L 7/18; H03L 5/00; H03L 7/0891; H03B 5/1852; H03B 5/18; H03B 1/00; H03B 7/06; H03J 3/20
USPC ....... 331/167, 117 FE, 96, 2, 107 SL, 177 V; 333/219.1
See application file for complete search history.

(56) References Cited

U.S. PATENT DOCUMENTS

| 6,798,305 B2 * | 9/2004 | Aikawa ................ H03B 5/1852 331/107 SL |
| 2013/0141175 A1 * | 6/2013 | Yin ...................... H03B 5/1847 331/96 |

FOREIGN PATENT DOCUMENTS

JP   2008-141291 A   6/2008

* cited by examiner

*Primary Examiner* — Arnold M Kinkead
(74) *Attorney, Agent, or Firm* — Baker Botts L.L.P.; Michael A. Sartori

(57) ABSTRACT

A resonant circuit to be connected to a negative resistance unit is disclosed. The resonant circuit includes a pair of resonant transmission lines electrically coupled to each other and a coupling transmission line connecting the resonant transmission lines. The resonant transmission lines and the coupling transmission line are formed on a semiconductor substrate. The resonant transmission lines have a length corresponding to a quarter wavelength ($\lambda/4$) of twice of the resonant frequency attributed to the resonant circuit.

16 Claims, 7 Drawing Sheets

(51) Int. Cl.
*H03L 3/00* (2006.01)
*H03L 7/089* (2006.01)
*H03L 7/06* (2006.01)
*H03L 7/18* (2006.01)
*H03L 7/10* (2006.01)

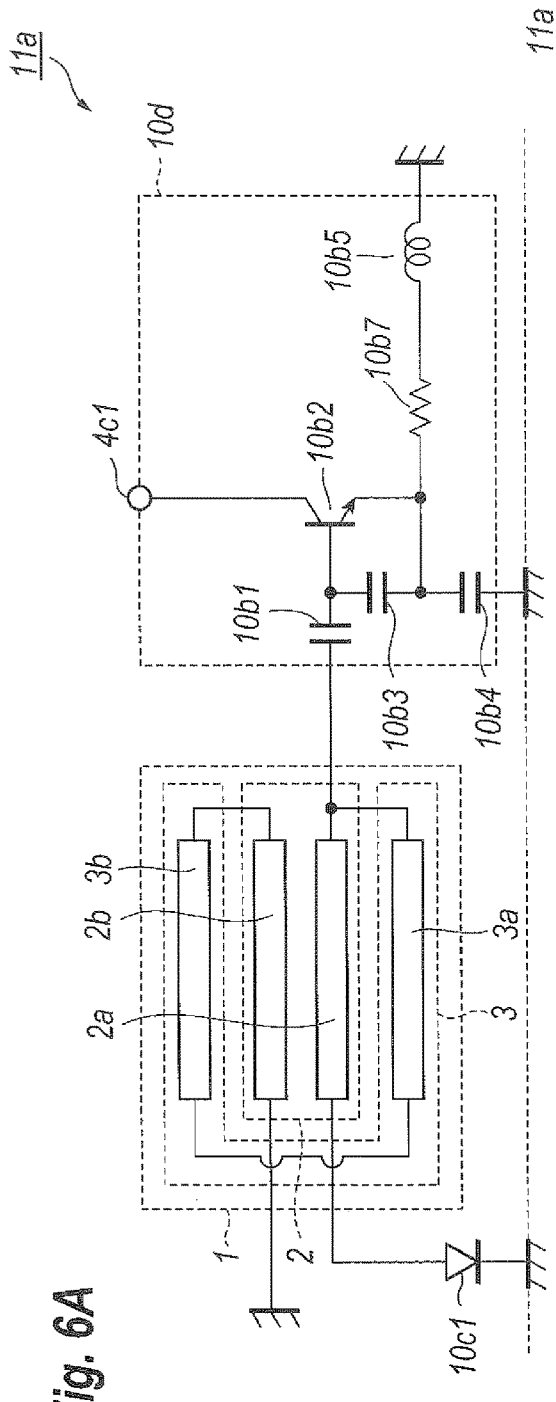
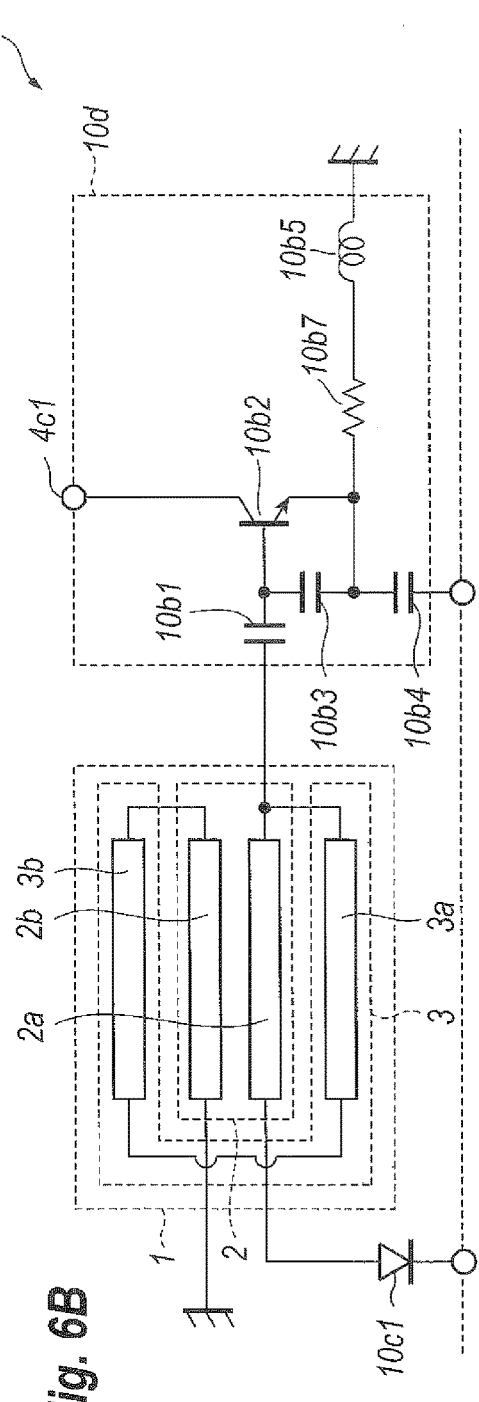
Fig. 6A
Fig. 6B

RESONANT UNIT, VOLTAGE CONTROLLED OSCILLATOR (VCO) IMPLEMENTING THE SAME, AND PUSH-PUSH OSCILLATOR IMPLEMENTING A PAIR OF VCOS

BACKGROUND OF THE INVENTION

1. Field of the Invention

The present application relates to a resonant circuit applicable to an oscillator.

2. Background Arts

Conventional communication systems usually implement a voltage controller oscillator (VCO), which includes a resonant unit and an amplifier, for generating an oscillating signal. The resonant unit often has a type of a micro-strip line because of relatively restricted signal loss and relatively high Q-value thereof, which are parameters showing steepness of the resonance, in order to reduce phase noises in frequency bands of a microwave and/or a millimeter wave.

A Japanese Patent laid open No. 2008-141291A has disclosed techniques relating to microwave filters and high frequency oscillators. The microwave filters and the high frequency oscillators disclosed therein have an oscillator and the band-passing filter integrated on a quartz substrate, which inevitably has an excellent Q-value. As such, a resonant unit has been integrally formed with a semiconductor amplifier but on a quartz substrate as the communication system request the higher level integration and further reduction of cost. However, such a resonant unit formed on the semiconductor material inevitably shows an inferior Q-value because of relatively smaller phase shift of micro-strip lines formed on the semiconductor material; accordingly, the phase noise of the oscillator becomes degraded. Setting the electrical length of the micro-strip line and the angular frequency of the oscillator are $\theta$ and $\omega_0$, respectively; the Q-value is given by:

$$Q = \frac{\omega_0}{2}\left|\frac{\partial \theta}{\partial \omega}\right|_{\omega=\omega_0}$$

The reflection co-efficient S11 of the lossless transmission line having the characteristic impedance of $Z_0$ and a grounded end is given by:

$$S_{11} = \frac{jZ\tan\theta - Z_0}{jZ\tan\theta + Z_0}$$

which means that, on the smith chart, the reflection co-efficient $S_{11}$ in the S-parameter rotates by 2θ measured from the origin without varying a diameter. The electrical length θ is given by:

$$\theta = (2\pi/\lambda_g)L,$$

$$\lambda_g = 2\pi c'/\omega$$

$$\therefore \theta = \omega L/c'$$

where L, c', and λg are an electrical length of the micro-strip line, propagation speed, and a wavelength of a signal transmitted on the micro-strip line, respectively.

That is, the signal frequency and the electrical length of the transmission line may determine the phase and the phase shift of the reflected signal. A key factor is that the phase shift thus configured for a micro-strip line has restricted the Q-value of the oscillator, that is, the micro-strip line integrally formed on the semiconductor material is hard to enhance the Q-value.

Various resonant units that increase the phase shift of the reflected signal have been investigated and developed. The crystal oscillator disclosed in the prior art above described has shown a high Q-value in relatively lower frequencies by utilizing the physical properties of the quartz. In a microwave band, a technique similar to those disclosed in the prior art above described may be applicable by using overtones of the oscillation. However, in further higher frequencies such as those in millimeter wavelengths, techniques similar to those above described becomes almost impossible. In such bands of the microwave band and/or the millimeter wave band, and an oscillator is also to be integrated with other devices, a resonant unit implementing primarily transmission lines such as micro-strip lines are generally used. A micro-strip line is put between capacitors with relatively small capacitance is one of such arrangements. However, those known techniques assume a transmission line with a quarter wavelength of an oscillation; the size of the resonant unit, accordingly, tends to be enlarged.

SUMMARY OF THE INVENTION

One aspect of the present application relates to a resonant unit having a resonant frequency, where the resonant unit of the application includes a semiconductor substrate, a pair of resonant transmission lines electrically coupled to each other, and a coupling transmission line. One of the resonant transmission lines includes an input port and a through port, and another of the resonant transmission lines includes an isolation port and a coupling port. The coupling transmission line connects the input port of the one of the resonant transmission lines to the coupling port of the other of the resonant transmission lines. A feature of the resonant unit of the present application is that the resonant transmission lines and the coupling transmission line are formed on the semiconductor substrate. The resonant transmission lines may have a length corresponding to a quarter wavelengths (λ/2) of twice of the resonant frequency.

Another aspect of the present application relates to a voltage controlled oscillator (VCO) that generates an oscillating signal at an oscillating frequency. The VCO includes a resonant unit and a negative resistance unit. The resonant unit has a pair of resonant transmission lines electrically coupled to each other, a coupling transmission line connecting the resonant transmission lines to each other, and a variable capacitor connected to one of the resonant transmission lines. The negative resistance unit includes a transistor connected to the one of the resonant transmission lines. A feature of the VCO of the present application is that the resonant transmission lines and the coupling transmission line are commonly formed on a semiconductor substrate, and the resonant unit and the negative resistance unit have, at the oscillating frequency, a negative sum of the real part of the respective impedance viewed from the other, and a substantially zero sum of the imaginary part of the respective impedance viewed from the other.

Still another aspect of the present application relates to a push-push oscillator including a pair of voltage controlled oscillators (VCOs). The VCOs each provides a resonant unit and a negative resistance unit. The resonant unit includes, a semiconductor substrate, a pair of resonant transmission lines electrically coupled to each other, a coupling transmission line electrically connecting the resonant transmission lines, and a variable capacitor connected to one of the resonant transmission lines. The resonant transmission lines and the coupling transmission line are commonly formed on a semiconductor substrate. The negative resistance units each include a transistor connected to the one of the resonant transmission lines and an output port. The resonant units and the negative resistance units have impedance determining the fundamental oscillating frequency of the VCOs. The output port of the one of the VCOs is connected to the output port of the other of the VCOs. A feature of the push-push oscillator of the present application is that the push-push oscillator generates oscillation signals of even overtones of the fundamental oscillating frequency, and substantially eliminates oscillation signals of odd overtones of the fundamental oscillating frequency.

BRIEF DESCRIPTION OF THE DRAWINGS

The foregoing and other purposes, aspects and advantages will be better understood from the following detailed description of a preferred embodiment of the invention with reference to the drawings, in which:

FIGS. 6A and 6B show operations of the push-push oscillator shown in FIG. 5.

DESCRIPTION OF EMBODIMENTS

Figure 1:
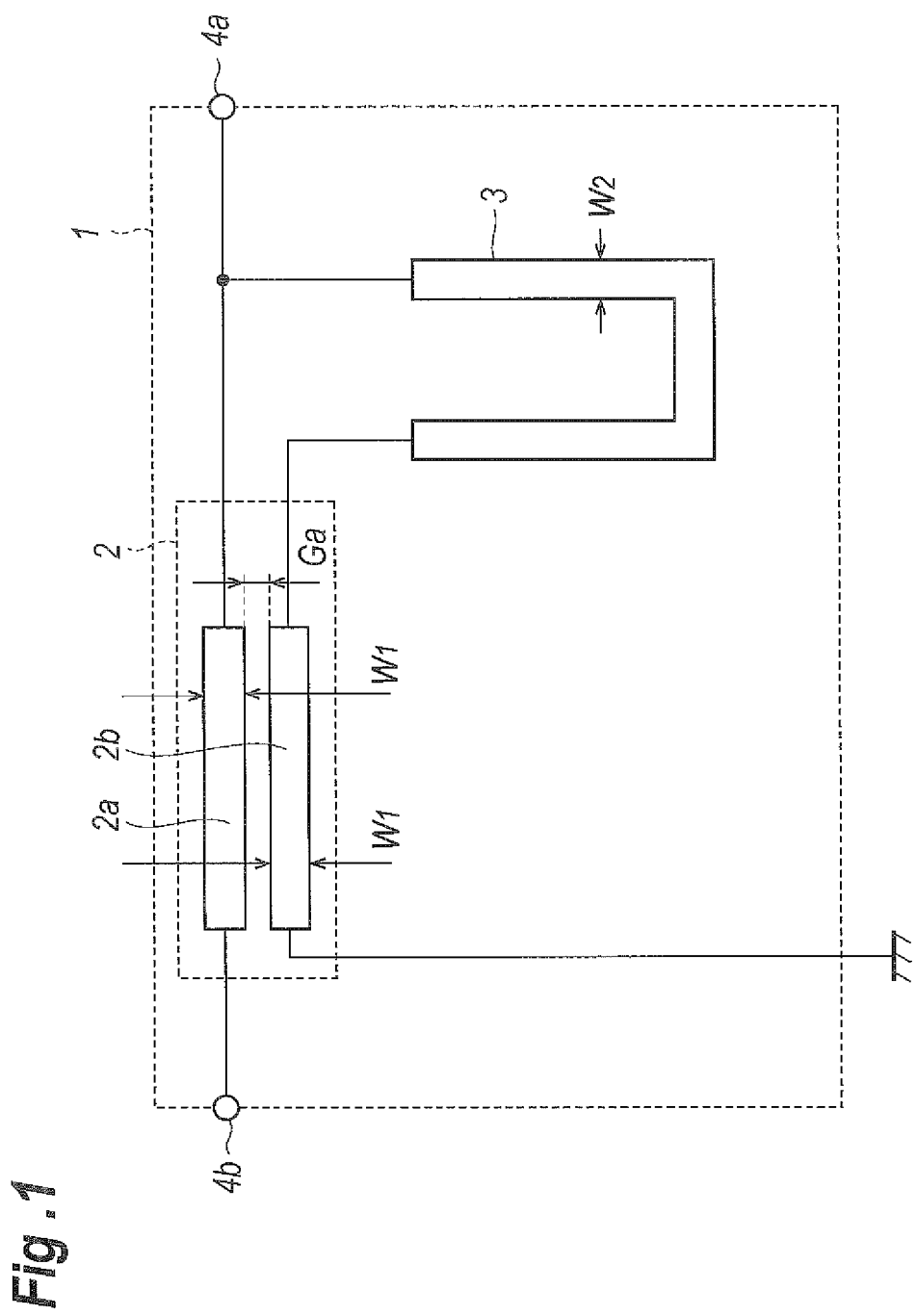
FIG. 1 schematically shows a diagram of a resonant circuit according to an embodiment of the present invention.

Next, some embodiments according to the present invention will be described as referring to drawings. In the description of the drawings, numerals or symbols same with or similar to each other will refer to elements same with or similar to each other without duplicating explanations.

A resonant circuit 1 according to one embodiment of the present invention will be described as referring to FIG. 1. The resonant circuit 1 shown in FIG. 1, which has microstrip lines showing relatively restricted signal loss of a type of a two-dimensional monolithic microwave integrated circuit (MMIC), is applicable to, for instance, a voltage controller oscillator (VCO). The resonant circuit 1 is formed on a primary surface of a substrate, which is omitted in the figures, made of, for instance, gallium arsenide (GaAs). The GaAs substrate may include the resonant circuit 1 within a dielectric film provided on a primary surface of the GaAs substrate, where the dielectric film may have a thickness of about 8 µm. The dielectric film may provide a ground metal on a surface thereof opposite to the surface in contact to the GaAs substrate. The resonant circuit 1 may include a coupling unit 2 and a coupling transmission line 3, where the coupling unit 2 and the coupling transmission line 3 may be made of metal same with each other.

The coupling unit 2 includes a pair of resonant transmission lines, 2a and 2b, electrically coupled to each other hand providing a gap Ga therebetween. One of the resonant transmission lines 2a has an input port and a through port. The input port is connected to an input terminal 4a of the resonant circuit 1. The through port of the resonant transmission line 2a is connected to another terminal 4b of the resonant circuit 1, which will be called as a bias terminal. The other of the resonant transmission lines 2b has a coupling port and an isolation port. The coupling port is connected to the input terminal 4a and the input port of the resonant transmission line 2a through the coupling transmission line 3. That is, the coupling transmission line 3 connects the resonant transmission lines in respective ends thereof. The bias terminal 4b of the resonant circuit 1 may be connected to an external bias source through an inductor and also grounded in high frequencies through a variable capacitor, typically a varactor diode, as shown in FIG. 2, while, the isolation port of the resonant transmission line 2b is directly grounded.

The resonant transmission lines, 2a and 2b, each have a length corresponding to about a quarter wavelength of a frequency subject to the resonant circuit 1, and a uniform width $W_1$ of around 60 µm, preferably 58 to 62 µm. The resonant transmission lines, 2a and 2b, are formed so as to make a gap Ga of around 6 µm, preferably 5.8 to 6.2 µm. The coupling transmission line 3 connects the input port of the one of the resonant transmission line 2a to the coupling port of the other of the resonant transmission line 2b. The coupling transmission line 3 has a length shorter than the length of the resonant transmission lines, 2a and 2b, and a width $W_2$ substantially same with the width W1 of the resonant transmission lines, 2a and 2b.

In the resonant circuit 1 of the embodiment shown in FIG. 1, a signal input to the input terminal 4a appears in the through port of the resonant transmission line 2a and the isolation port of the other resonant transmission line 2b, and appears in the coupling port reflected at the through port and the isolation port. Also, the signal input to the input terminal 4a appears in the coupling port of the resonant transmission line 2b passing through the coupling transmission line 3. Accordingly, the resonant circuit 1 may vary the phase at frequencies about a half of the quarter wavelength corresponding to the length of the resonant transmission lines, 2a and 2b, in the coupling unit 2. Also, the signal transmitting through the coupling unit 2 and the signal transmitting through the coupling transmission line 3 may be coupled at the coupling port of the coupling unit 2 to be resonantly strengthened thereby. Therefore, the resonant circuit 1 shows an excellent Q-value and reduces the phase noise with a compact and simple circuit. The length of the resonant transmission lines, 2a and 2b, corresponds to a quarter wavelength of the frequency twice of the resonant frequency when the resonant circuit 1 is implemented in a resonant unit, and the length of the coupling transmission line 3 is shorter than the length of the coupling unit 2. The resonant circuit 1 thus configured may effectively couple the signal transmitting the coupling unit 2 with the signal transmitting through the coupling transmission line 3, and increases a range of the phase shift around the resonant frequency when the resonant circuit 1 is implemented within a resonance unit. The length of the coupling transmission line 3 becomes an optimum between 0 and a quarter wavelength of the resonance frequency; specifically, about a half of the quarter wavelength gives an optimum length.

Figure 2:
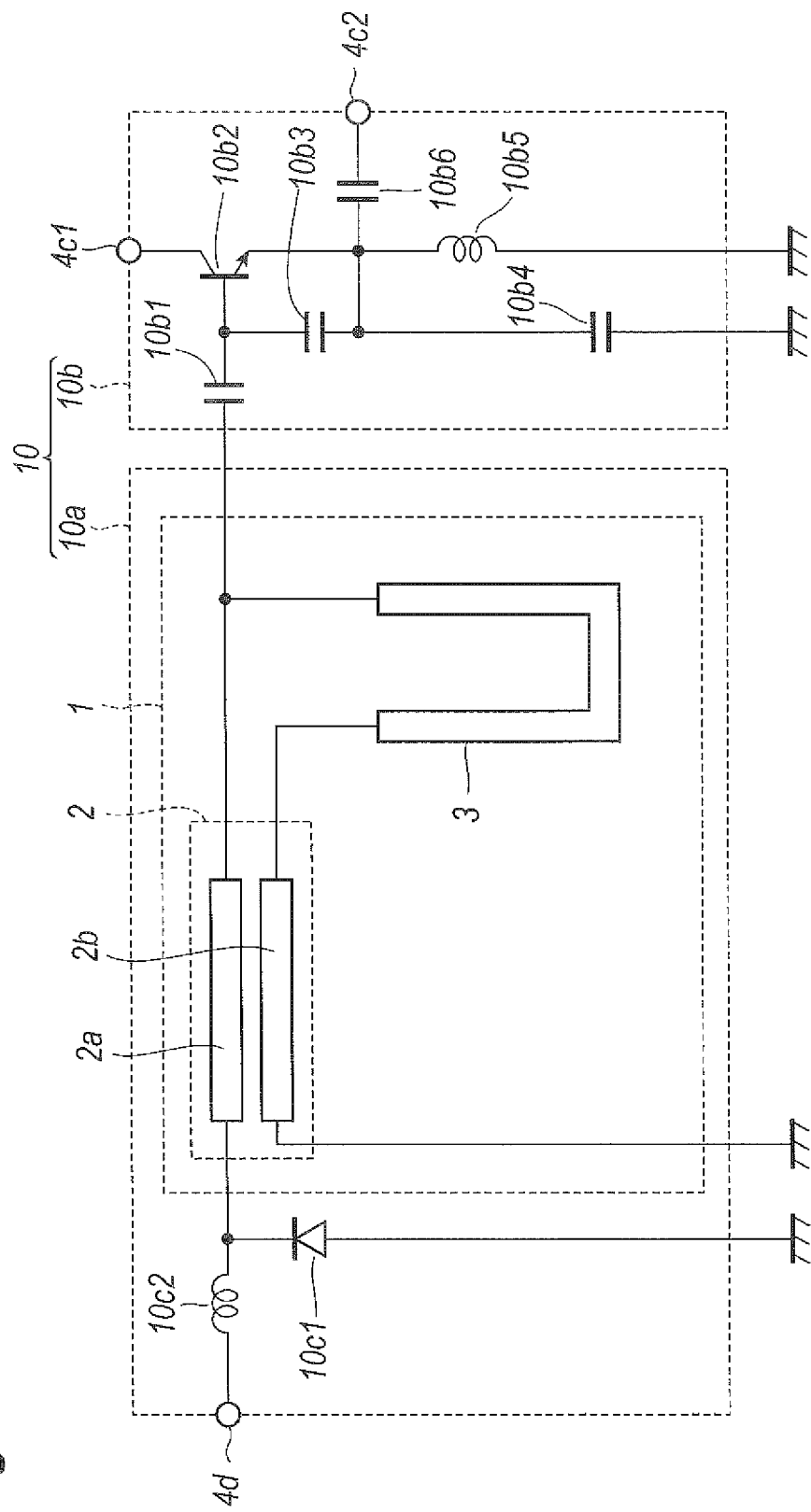
FIG. 2 shows a circuit diagram of a voltage controller oscillator (VCO) implementing the resonant circuit shown in FIG. 1.

FIG. 2 shows a circuit diagram of a voltage controller oscillator (VCO) implementing the coupling circuit 1 shown in FIG. 1, The VCO 10 shown in FIG. 2 has a type of, what is called, the Colpitts oscillator including a resonant unit 10a and negative resistance unit 10b. The resonant unit 10a includes a resonant circuit 1 of the embodiment of the present invention, a varactor diode $10c1$, and an inductor $10c2$. The negating resistance unit $10b$ includes capacitors, $10b1$, $10b3$, $10b4$, and $10b6$, a transistor $10b2$, and an inductor $10b5$.

Referring to one of the resonant transmission lines $2a$ of the coupling unit 2, the input port thereof is connected to the negative resistance unit $10b$ and the coupling transmission line 3 as described referring to FIG. 1; while, the through port is connected to the inductor $10c2$ and the varactor diode $10c1$. The through port is indirectly grounded in high frequencies through the varactor diode $10c1$. In the negative resistance unit $10b$, the transistor $10b2$ in the base thereof is connected to the input port of the resonant transmission line $2a$ in the resonant circuit 1 through the capacitor $10b1$, which is a coupling capacitor. Also, the transistor $10b2$ in the base and the emitter thereof is bypassed by the capacitor $10b3$; the emitter is grounded through a parallel circuit of the capacitor $10b3$ and the inductor $10b5$, and outputs a signal to the output terminal $4c2$ through the capacitor $10b6$. The transistor $10b2$ is supplied with a bias to the collector thereof from the bias port $4c$.

The bias terminal $4d$ receives a variable bias that varies the capacitance of the varactor diode $10c1$; accordingly, the resonant frequency of the resonant unit 2 varies. The varactor diode $10c$ of the present embodiment has an anode area of 7,200 $\mu m^2$ with a multi-finger arrangement. The capacitors, $10b1$, $10b3$, $10b4$, and $10b6$, have the capacitance of 0.4, 0.8, 0.8 and 0.5 pF, respectively. The transistor $10b2$ is a type of, what is called, a hetero-bipolar transistor (HBT) primarily made of InGaP and has an active area of 580 $\mu m^2$ with the multi-fingered arrangement. The inductor $10b5$ has the inductance of about 2 nH. The negative resistance unit $10b$ is biased with 5V through the bias terminal $4c1$. The output terminal $4c2$ may output an RF signal generated by the VCO 10.

Figure 3A:
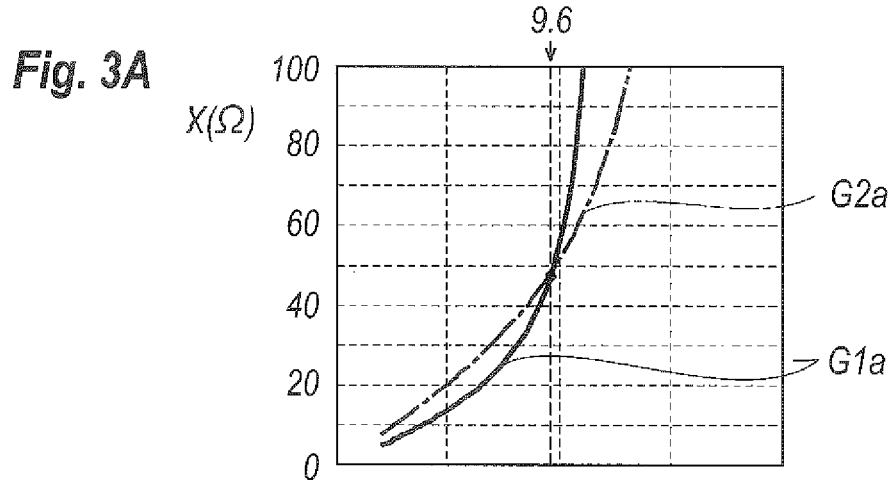
FIGS. 3A to 3C show performances of the resonant circuit shown in FIG. 1.
Figure 3B:
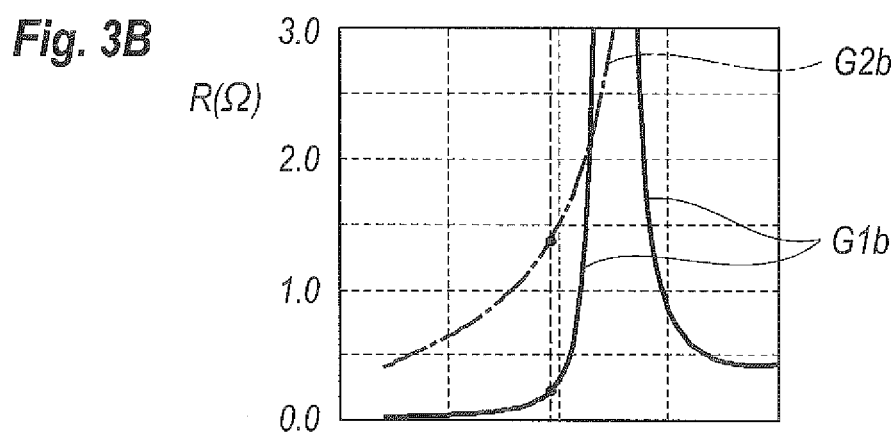
Figure 3C:
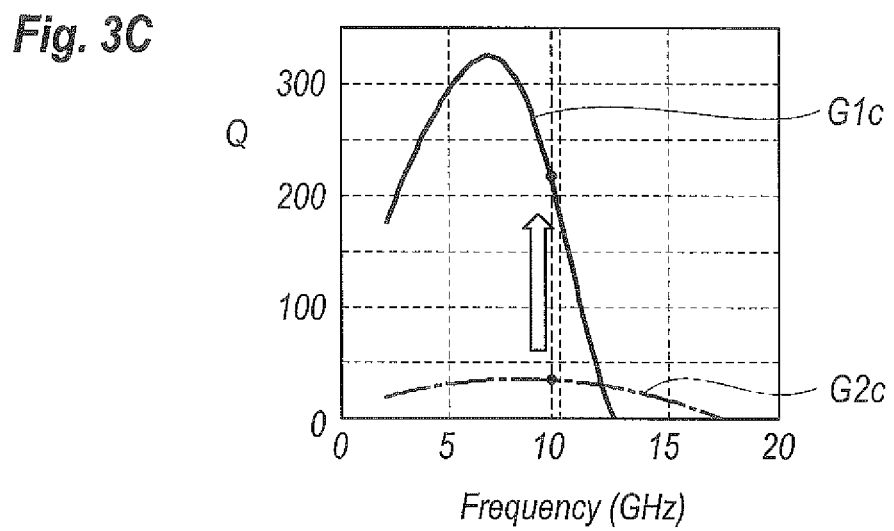
Figure 7:
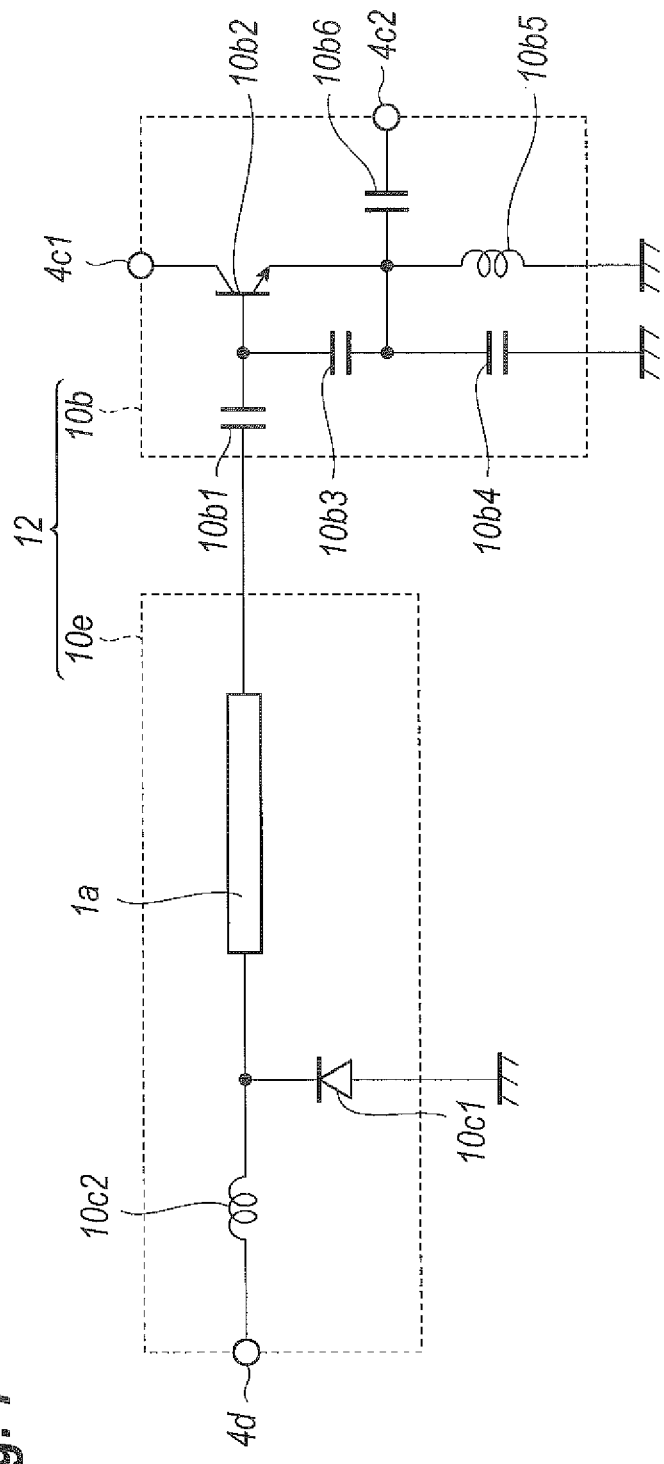
FIG. 7 shows a circuit diagram of a VCO implementing a conventional coupling circuit.

Performance of the VCO 10 shown in FIG. 2 will be described as referring to FIGS. 3A to 4B, where FIGS. 3A to 3C show performances of the resonant circuit 1 shown in FIG. 1, where FIGS. 3A to 3C also denote performance shown by a VCO 12 implementing a conventional resonant unit $10e$ whose diagram is shown in FIG. 7. The conventional VCO 12 shown in FIG. 7 provides the resonant unit $10e$ and the negative resistance unit $10b$, which is same with that of the present invention shown in FIG. 2. The resonant unit $10e$ provides a transmission line $1a$ instead of the resonant transmission lines, $2a$ and $2b$, of the resonant circuit 1 of the present invention. Other arrangements in the resonant unit $10e$ are the same with those of the resonant unit $10a$. That is, the conventional resonant unit $10e$ provides the inductor $10c2$ and the varactor diode $10c1$ for varying the resonant frequency of the resonant unit $10e$.

FIGS. 3A to 3C compare the Q-value of the VCO 10 of the present embodiment with that of the conventional VCO 12, where Q-value represents the steepness of the resonance. FIG. 3A denotes the imaginary part X of the impedance of the resonant unit $10a$ of the embodiment (G1$a$) and that $10e$ of the conventional one (G2$a$), where the impedance is viewed from the negative resistance unit $10b$. FIG. 3B compares the real part of the impedance R of those resonance units, $10a$ and $10e$, each denoted by behaviors of G2$a$ and G2$b$, where the impedance is also viewed from the negative resistance unit $10b$. FIG. 3C compares the Q-value of the resonant units $10a$ and $10e$, where the Q-value may be determined by a ratio of the imaginary part X against the real part R of the impedance, namely, Q=X/R. In FIGS. 3A to 3C, the horizontal axes correspond to frequencies of signals passing through or entering the resonant circuits, 1 and $1a$, which is inversely proportional to wavelengths of the signals.

Conditions under which the VCOs, 10 and 12, may oscillate are first determined, where the conditions are given by two conditions. That is one of conditions is that the real part of the impedance of the negative resistance unit $10b$ and that of the resonant unit, $10a$ or $10e$, each viewed from the other causes a negative sum, and the other condition is that the imaginary part of the impedance of two units viewed from the other causes a zero sum. In the present embodiment, the negative resistance unit $10b$ has the impedance of about $-48\Omega$ in the imaginary part thereof, the VCOs, 10 and 12, may oscillate when the resonant unit, $10a$ or $10e$, shows the impedance of 48$\Omega$ in the imaginary part thereof viewed from the negative resistance unit $10b$, which corresponds to about 9.6 GHz as shown in FIG. 3A. When the oscillation frequency becomes 9.6 GHz the real parts of the impedance of the resonant unit, 10 and 12, viewed from the negative resistance unit $10b$ become 0.23$\Omega$ and 1.38$\Omega$, respectively; and the Q-values may be calculated as 208 and 34.9, respectively, where the former is far greater than the latter.

Figure 4A:
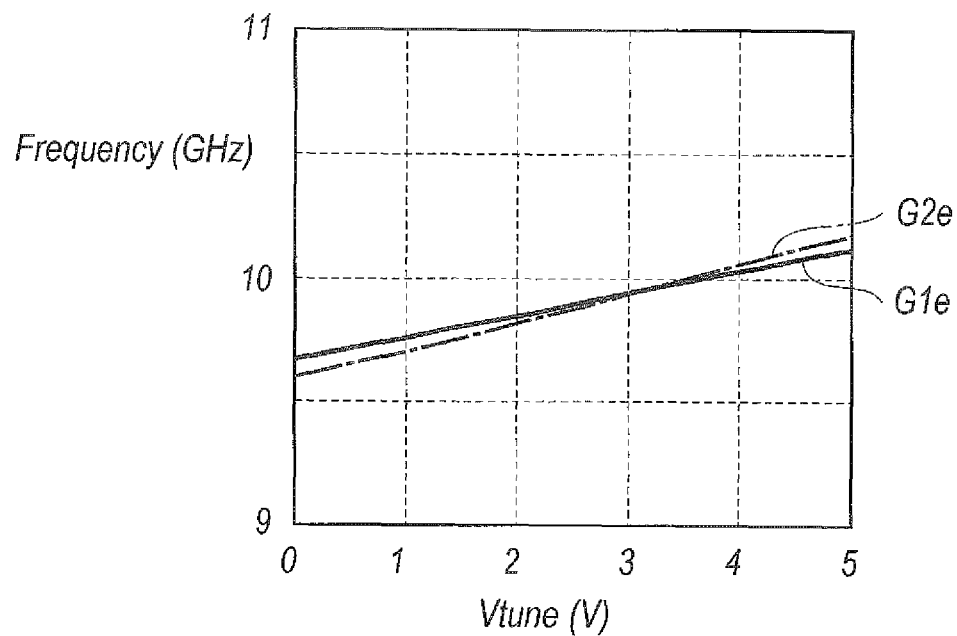
FIGS. 4A and 4B shows performances of the VCO implementing the resonant circuit according to an embodiment of the present invention.
Figure 4B:
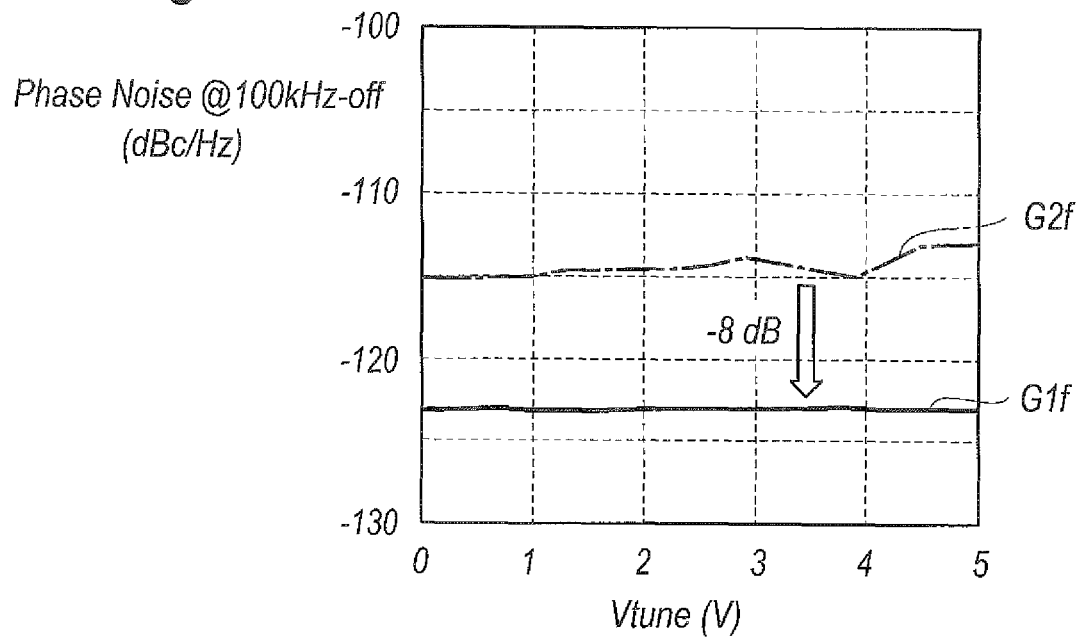

FIGS. 4A and 4B each compare the frequency range and the phase noise of the VCOs, 10 and 12. Horizontal axes of FIGS. 4A and 4B correspond to biases supplied from the bias terminal $4d$ to the varactor diode $10c1$ through the inductor $10c2$; while, the vertical axis of FIG. 4A denotes the resonant frequency of the signal passing through or entering the resonant circuits, 1 and $1a$, which corresponds to the oscillation frequency of the VCOs, 10 and 12; and the phase noise measured at a frequency apart by 100 kHz from the oscillating frequency. As shown in FIG. 4A, the VCO 10 of the present embodiment show a behavior of the oscillating frequency against the bias Vtune (V) similar to that of the conventional VOC 12 shown in FIG. 7. That is, the VCO 10 has a frequency tuning range substantially same with that obtained in the conventional VCO 12. However, the VCO 10 may drastically decrease the phase noise by about 8 dB compared with the conventional VCO 12.

Figure 5:
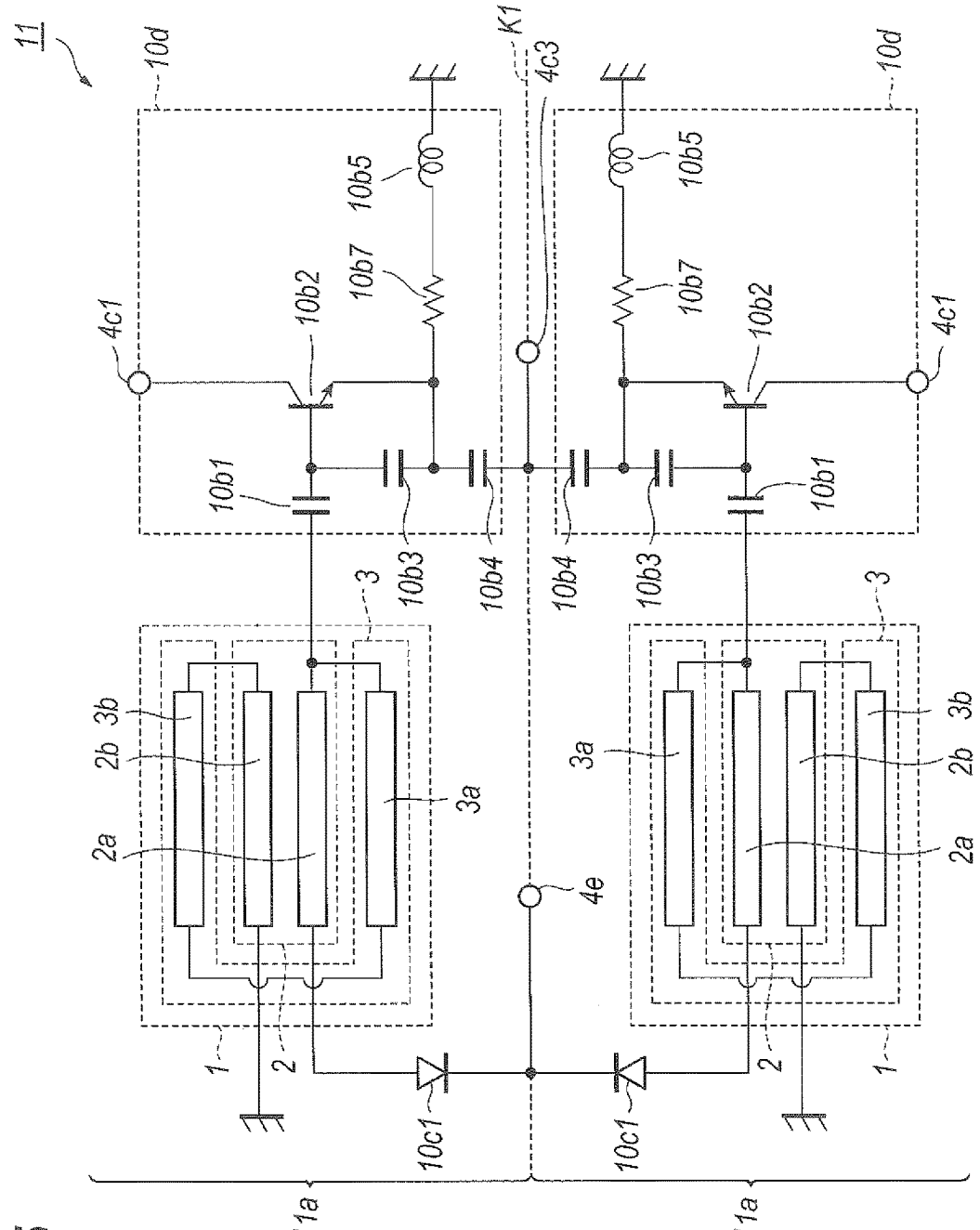
FIG. 5 shows a circuit diagram of a push-push oscillator implementing two resonant circuits shown in FIG. 1.

Next, an application of the resonant circuit 1 will be described as referring to FIG. 5, where FIG. 5 shows a circuit diagram of a push-push oscillator 11 implementing two resonant units $11a$. The push-push oscillator 11 provides two resonant units $11a$, two negative resistance units $10d$, two virtual terminals, $4e$ and $4c1$, and two bias terminals $4c1$, where two resonant units $11a$ are symmetrically disposed with respect to a virtual reference line K1 that includes two terminals, $4e$ and $4c3$. The terminal $4e$, which is another bias terminal, receives a bias supplied to the varactor diodes $10c1$ to vary the junction capacitance of the varactor diodes $10c1$. The oscillation frequency of the VCOs varies depending on the bias supplied from the bias terminal $4e$. The terminal $4c3$, which may be the output terminal of the push-push oscillator 11, outputs the signal with the oscillating frequency. When two VCOs independently satisfy the oscillating conditions above described by assuming the reference level K1 as a virtual ground, two VCOs may generate signals with the oscillating frequency same with each other but the phases thereof are opposite to each other. Although the coupling transmission line 3 in the respective resonant units $11a$ in FIG. 5 each provide two elementary coupling transmission lines, $3a$ and $3b$, the arrangement of the coupling transmission line 3 are same with that illustrated in FIGS. 1 and 2. Two elementary coupling transmission lines, $3a$ and $3b$, are illustrated only by the explanation sake.

The resonant unit 11a in the push-push oscillator 11 provides the resonant circuit 1 and the negative resistance unit 10d, where the input port of the resonant transmission line 2a is connected to the negative resistance unit 10d, the through port thereof is connected to the varactor diode 10c1, and the isolation port is grounded. The negative resistance unit 10d, similar to the aforementioned negative resistance unit 10b, includes capacitors, 10b1, 10b3, 10b4, a transistor 10b2, and an inductor 10b5, but omits the capacitor 10b6 through which the transistor 10b2 outputs the oscillating signal. Instead, the negative resistance unit 10d includes a resistor 10b7 which is not implemented in the aforementioned negative resistance unit 10b. In the negative resistance unit 10d of the present embodiment, the emitter of the transistor 10b2 is grounded through a series circuit of the resistor 10b7 and the capacitor 10b5, and connected to the terminal 4c3 through the capacitor 10b4. On the other hand, the former negative resistance unit 10b provides a peaking circuit comprised of a parallel circuit of the inductor 10b5 and the capacitor 10b4.

Because the resonant units 11a each cause oscillating signals whose phases opposite to each other, these oscillating signals are cancelled at the terminal 4c3, the terminal 4c3 is virtually grounded as illustrated in FIG. 6A, which means that substantially no oscillating signal may be output from the terminal 4c3. Under such a condition the resonant unit 11a may cause a signal with relatively greater amplitude because no load is connected to the negative resistance unit 10d. The signal with greater amplitude may generate harmonics or overtones of the fundamental frequency. The push-push VCO 11 may operate as the terminal 4c3 is opened for the even harmonies as shown in FIG. 6B, and the outputs of the negative resistance units 10d are composed in a phase at the terminal 4c3. Thus, the push-push VCO 11 may generate the even harmonics with relatively greater amplitude from the terminal 4c3. Because the terminal 4c3 may be regarded as the ground for the fundamental mode and for the odd harmonics, the push-push VCO 11 of the embodiment generates substantially no signal.

The push-push VCO 11 shows the lower phase noise because the fundamental mode of the oscillation is cancelled between two units, enables an active device with limited high-frequency performance to generate an oscillation exceeding the limitation of the active device, and makes other devices, such as a filter for eliminating the fundamental mode, unnecessary. Also, the resonant unit 11a of the present embodiment provides the resonant circuit including only two resonant transmission lines coupling to each other and the coupling transmission lines both formed on a semiconductor substrate integrally with the transistor in the negative resistance unit. Thus, the VCO including the resonant unit and the negative resistance unit may be formed in compact.

While particular embodiments of the present invention have been described herein for purposes of illustration, many modifications and changes will become apparent to those skilled in the art. Accordingly, the appended claims are intended to encompass all such modifications and changes as fall within the true spirit and scope of this invention,

What is claimed is:

1. A resonant circuit having a resonant frequency, comprising:
a semiconductor substrate; and
a pair of resonant transmission lines electrically coupled to each other, one of the resonant transmission lines including an input port and a through port, an other of the resonant transmission lines including an isolation port and a coupling port, the resonant transmission lines each having a length corresponding to a quarter wavelength ($\lambda/4$) of twice of the resonant frequency, and
a coupling transmission line connecting the input port of the one of the resonant transmission lines to the coupling port of the other of the resonant transmission lines, the coupling transmission line having a length shorter than the length of the resonant transmission lines,
wherein the resonant transmission lines and the coupling transmission line are provided on the semiconductor substrate.

2. The resonant circuit of claim 1,
wherein the substrate is made of gallium arsenide (GaAs).

3. The resonant circuit of claim 2,
wherein the substrate includes a dielectric film on a primary surface thereof,
wherein the resonant transmission lines and the coupling transmission line are provided on the primary surface of the semiconductor substrate, the dielectric film covering the resonant transmission lines and the coupling transmission line, and
wherein the dielectric film is covered with a ground metal.

4. The resonant circuit of claim 1,
wherein the resonant transmission lines each have a width of 58 to 62 µm, with a gap of 5.8 to 6.2 µm, and the coupling transmission line has a width substantially same with the width of the resonant transmission lines.

5. The resonant circuit of claim 1,
further including a variable capacitor connected between the through port of one of the resonant transmission lines and a ground,
wherein the variable capacitor varies capacitance thereof by being supplied with a bias.

6. A voltage controlled oscillator (VCO) that generates an oscillating signal at an oscillating frequency, the VCO comprising:
a resonant circuit including:
a semiconductor substrate, a pair of resonant transmission lines electrically coupled to each other, a coupling transmission line, wherein one of the resonant transmission lines includes an input port and a through port, and another of the resonant transmission lines includes an isolation port and a coupling port; the coupling transmission line being connected between the input port of the one of the resonant transmission lines and the coupling port of the another of the resonant transmission lines, the resonant transmission lines each having a length corresponding to a quarter wavelength ($\lambda/4$) of twice of the oscillating frequency, the coupling transmission line having a length shorter than the length of the resonant transmission lines, the resonant transmission lines and the coupling transmission line being formed on the semiconductor substrate, and
a variable capacitor connected to the through port of the one of the resonant transmission lines, the variable capacitor varying capacitance thereof depending on a bias supplied thereto; and
a negative resistance unit including a transistor connected to the input port of the one of the resonant transmission lines,
wherein the resonant circuit has impedance viewed from the negative resistance unit and the negative resistance unit has impedance viewed from the resonant circuit, the impedance of the resonant circuit in an imaginary part thereof added with the impedance of the negative resistance unit in an imaginary part thereof being substantially zero at the oscillating frequency, the impedance of the resonant circuit in a real part thereof added with the impedance of the negative resistance unit in a real part thereof being negative at the oscillating frequency.

7. The voltage controlled oscillator of claim 6, wherein the substrate is made of gallium arsenide (GaAs).

8. The voltage controlled oscillator of claim 7, wherein the substrate includes a dielectric film on a primary surface thereof,
wherein the resonant transmission lines and the coupling transmission line are provided on a primary surface of the semiconductor substrate, the dielectric film covering the primary surface of the semiconductor substrate, the resonant transmission lines and the coupling transmission line, and
wherein the dielectric film is covered with a ground metal.

9. The voltage controlled oscillator of claim 6, wherein the resonant transmission lines each have a width of 58 to 62 μm, with a gap of 5.8 to 6.2 μm, and the coupling transmission line has a width substantially same with the width of the resonant transmission lines.

10. The voltage controlled oscillator of claim 6, wherein the transistor is a type of a heterojunction bipolar transistor (HBT) containing InGaP.

11. A push-push oscillator, comprising:
a pair of voltage controlled oscillators (VCOs) each having a resonant circuit and a negative resistance unit,
wherein each of the resonant circuits in the VCOs includes a semiconductor substrate, a pair of resonant transmission lines electrically coupled to each other, a coupling transmission line electrically connecting the resonant transmission lines, and a variable capacitor connected to the one of the resonant transmission lines, the resonant transmission lines and the coupling transmission line being provided on the semiconductor substrate, the resonant transmission lines each having a length corresponding to a quarter wavelength (λ/4) of twice of the fundamental oscillating frequency, the coupling transmission line having a length shorter than the length of the resonant transmission lines,
wherein each of the negative resistance units in the VCOs includes a transistor and an output port, wherein the resonant circuits and the negative resistance units have impedance determining a fundamental oscillating frequency of the VCOs;
wherein the output port of the one of the VCOs is connected to the output port of the other of the VCOs, and
wherein the push-push oscillator generates oscillation signals of even overtones of the fundamental oscillating frequency and substantially eliminates oscillation signals of odd overtones of the fundamental oscillating frequency.

12. The push-push oscillator of claim 11, wherein the semiconductor substrate is made of gallium arsenide (GaAs).

13. The push-push oscillator of claim 11, wherein the semiconductor substrate includes a dielectric film on a primary surface thereof,
wherein the resonant transmission lines and the coupling transmission line are provided on a primary surface of the semiconductor substrate, the dielectric film covering the primary surface of the semiconductor substrate, the resonant transmission lines and the coupling transmission line, and
wherein the dielectric film is covered with a ground metal.

14. The push-push oscillator of claim 11, wherein the resonant transmission lines each have a width of 58 to 62 μm, with a gap of 5.8 to 6.2 μm, and the coupling transmission line has a width substantially same with the width of the resonant transmission lines.

15. The push-push oscillator of claim 11, wherein the variable capacitors in the respective resonant circuits are commonly biased.

16. The push-push oscillator of claim 11, wherein the resonant circuits and the negative resistance units each have impedance with a real part and an imaginary part, the real parts of the impedance of the resonant circuit and the negative resistance unit having a negative sum at the fundamental oscillating frequency, the imaginary parts of the impedance of the resonant circuit and the negative resistance unit having a zero sum at the fundamental oscillating frequency.

* * * * *